United States Patent
Griswold et al.

(10) Patent No.: US 7,558,614 B2
(45) Date of Patent: Jul. 7, 2009

(54) METHOD AND APPARATUS FOR IMPROVED TRANSMISSION-SIDE ACCELERATED PPA-BASED VOLUME-SELECTIVE MAGNETIC RESONANCE IMAGING

(75) Inventors: Mark Griswold, Shaker Heights, OH (US); Stephan Kannengiesser, Erlangen (DE)

(73) Assignee: Siemens Aktiengesellschaft, Munich (DE)

( * ) Notice: Subject to any disclaimer, the term of this patent is extended or adjusted under 35 U.S.C. 154(b) by 574 days.

(21) Appl. No.: 11/408,552

(22) Filed: Apr. 21, 2006

(65) Prior Publication Data

US 2007/0013374 A1    Jan. 18, 2007

(30) Foreign Application Priority Data

Apr. 22, 2005    (DE)    ............ 10 2005 018 937

(51) Int. Cl.
  *A61B 5/05*   (2006.01)
  *G01V 3/00*   (2006.01)
(52) U.S. Cl. .................. 600/410; 324/309; 324/307
(58) Field of Classification Search ............... None
  See application file for complete search history.

(56) References Cited

U.S. PATENT DOCUMENTS

| | | | |
|---|---|---|---|
| 6,650,925 B2* | 11/2003 | Wang ............ | 600/410 |
| 6,680,610 B1 | 1/2004 | Kyriakos et al. | |
| 6,710,686 B2* | 3/2004 | Mertelmeier et al. ...... | 324/314 |
| 6,734,673 B2* | 5/2004 | Agrikola ............ | 324/318 |
| 6,801,035 B2* | 10/2004 | Wang ............ | 324/309 |
| 6,828,788 B2* | 12/2004 | Wang ............ | 324/309 |
| 6,943,547 B2* | 9/2005 | Bydder et al. ............ | 324/307 |
| 6,949,928 B2* | 9/2005 | Gonzalez Ballester et al. ............ | 324/307 |
| 7,002,344 B2* | 2/2006 | Griswold et al. ............ | 324/309 |
| 7,102,348 B2* | 9/2006 | Zhang et al. ............ | 324/309 |
| 2005/0187458 A1 | 8/2005 | Kannengiesser et al. | |
| 2006/0261810 A1* | 11/2006 | Fautz et al. ............ | 324/309 |
| 2006/0284812 A1* | 12/2006 | Griswold et al. ............ | 345/92 |
| 2007/0241751 A1* | 10/2007 | Kholmovski et al. ........ | 324/307 |
| 2008/0180099 A1* | 7/2008 | Fautz et al. ............ | 324/309 |

OTHER PUBLICATIONS

"Transmit Sense," Katscher et al., Magnetic Resonance in Medicine, vol. 49 (2003), pp. 144-150.
"Parallel Excitation With an Array of Transmit Coils," Yudong Zhu, Magnetic Resonance in Medicine, vol. 51, (2004), pp. 775-784.
"Unfold-sense: A Parallel MRI Method with Self-Calibration and Artifact Suppression," Madore, Magnetic Resonance in Medicine, vol. 52 (2004), pp. 310-320.

* cited by examiner

*Primary Examiner*—Long V Le
*Assistant Examiner*—Angela M Hoffa
(74) *Attorney, Agent, or Firm*—Schiff Hardin LLP

(57) ABSTRACT

In a method for determining transmission coil-specific RF excitation pulses for component coils of a transmission coil array for accelerated, PPA-based volume-selective magnetic resonance excitation of a tissue region of a patient, and a magnetic resonance tomography apparatus operating according to the method, a first series of volume-selective RF excitation pulses along a first transmission trajectory in transmission κ-space is successively individually radiated by the component coils of the transmission coil array and the resulting magnetic resonance signals are received, and a second series of volume-selected RF excitation pulses along a further reduced transmission trajectory in transmission κ-space is simultaneously radiated by all component coils of the transmission coil array and the resulting magnetic resonance signals are received, and a complete transmission trajectory in transmission κ-space is then determined from which combination coefficients are calculated, and the coil specific RF excitation pulses are then calculated from the combination coefficients in order to produce a desired excitation profile.

9 Claims, 7 Drawing Sheets

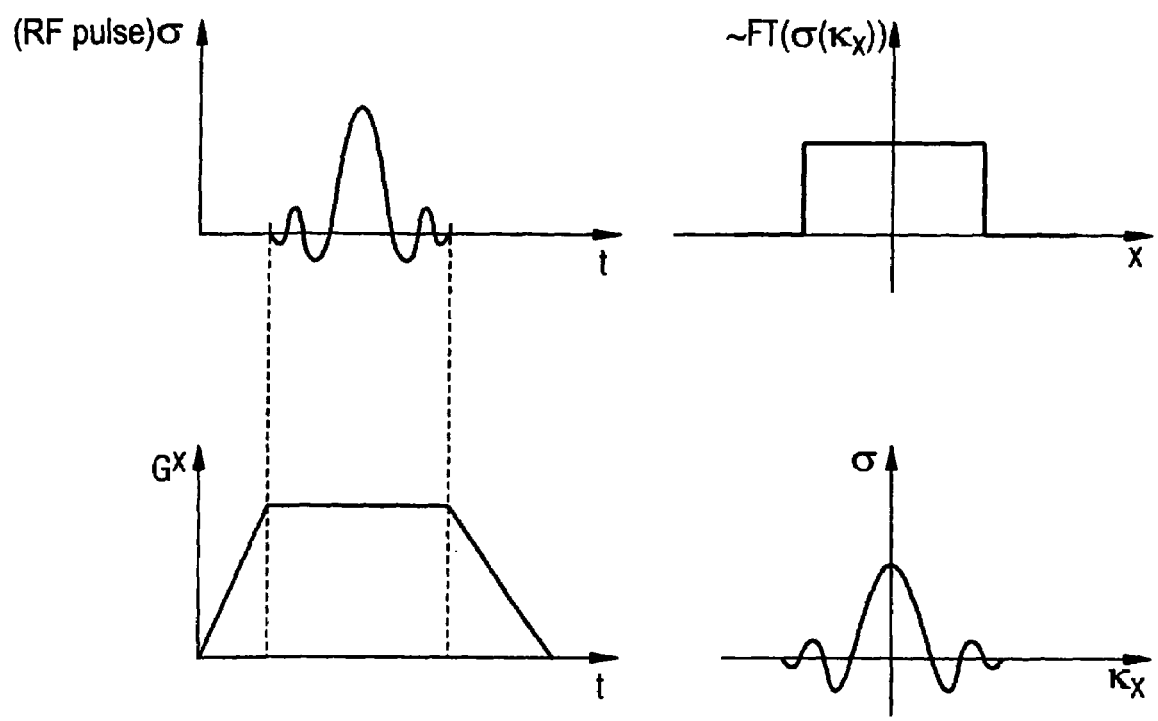

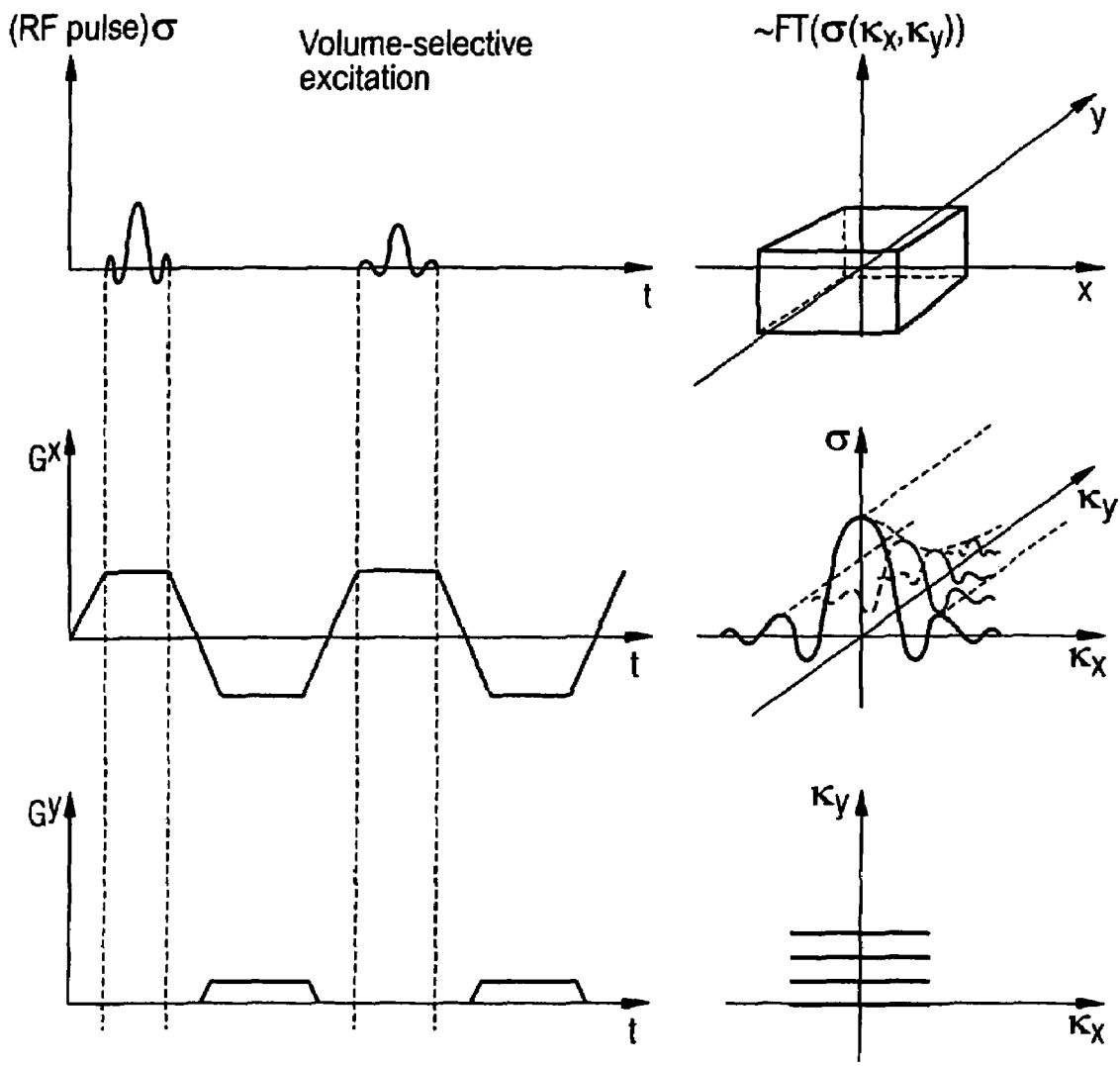

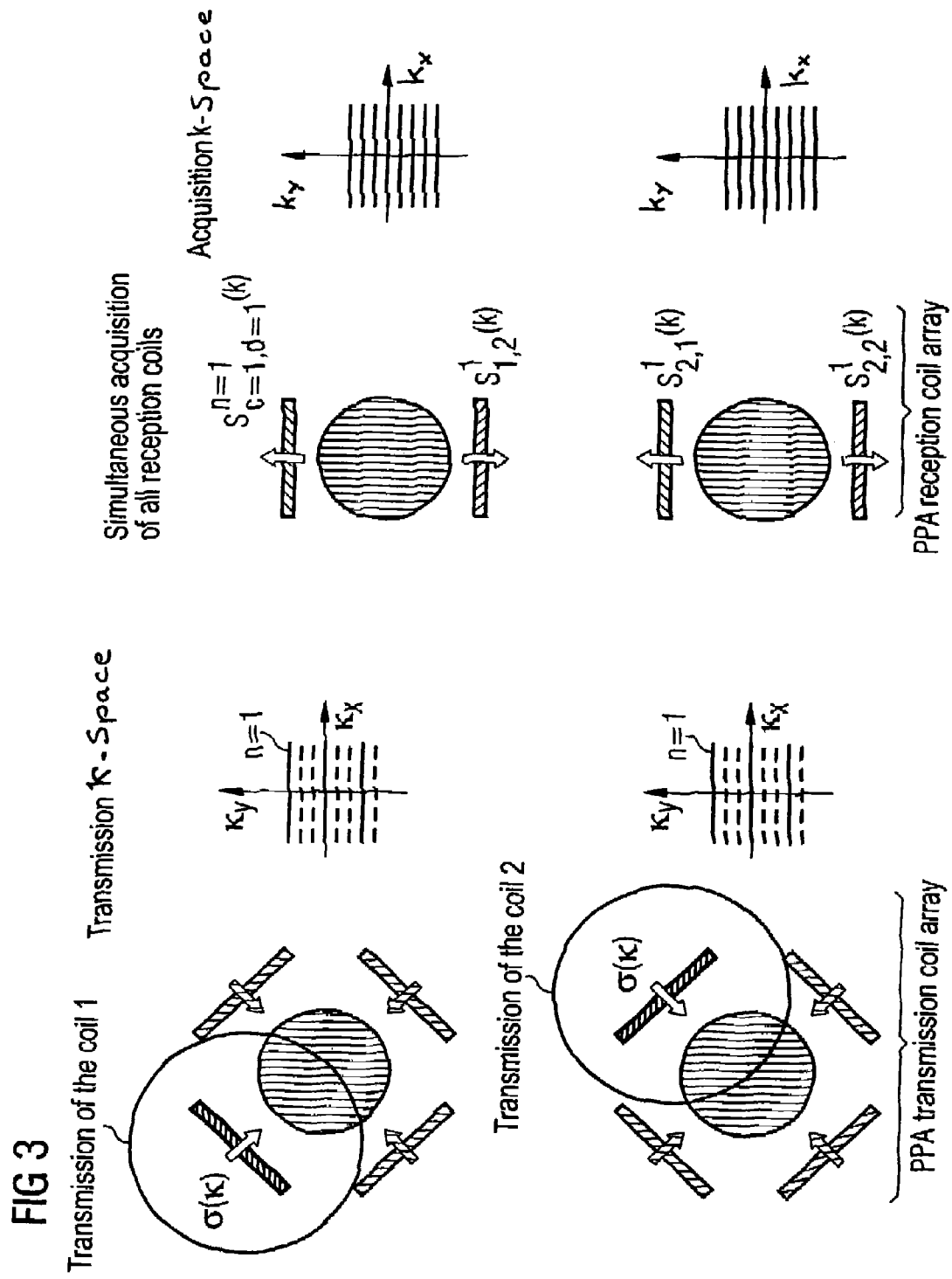

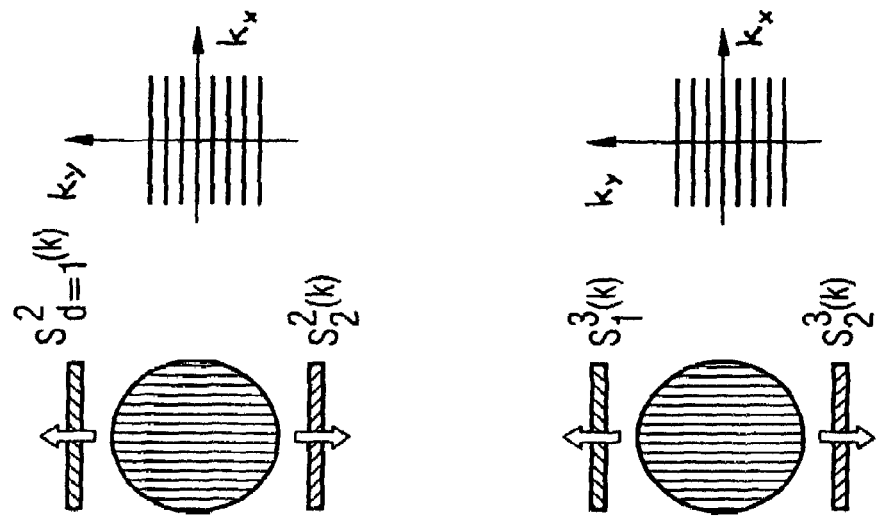
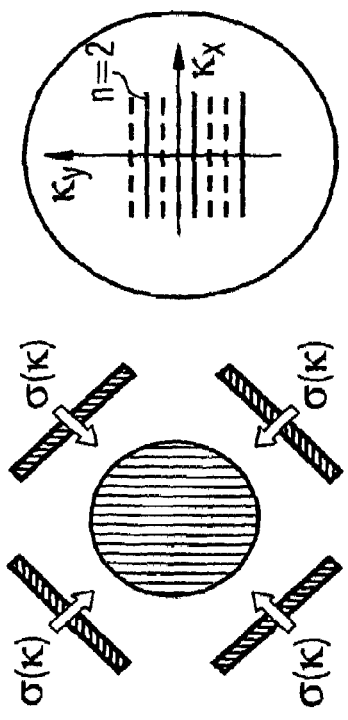

FIG 5
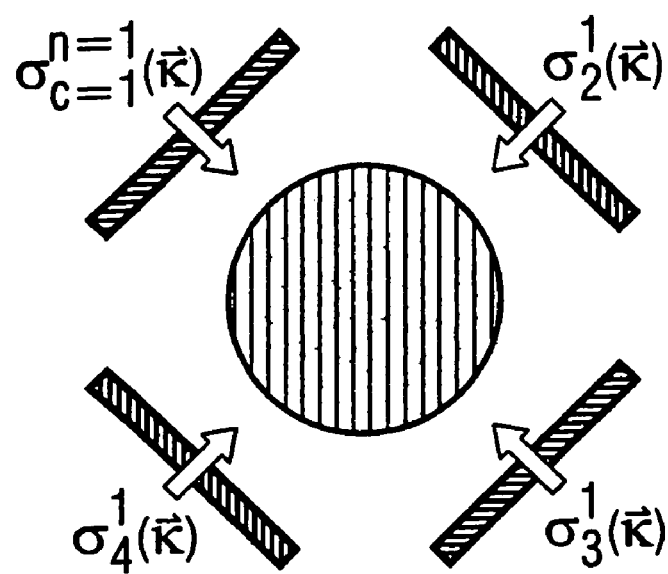
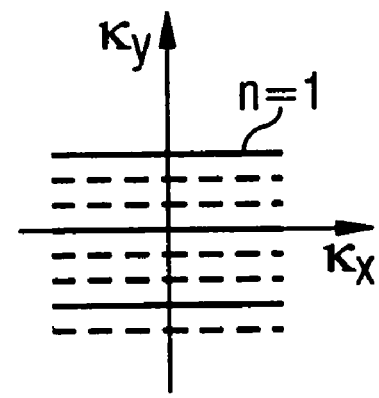

FIG 6
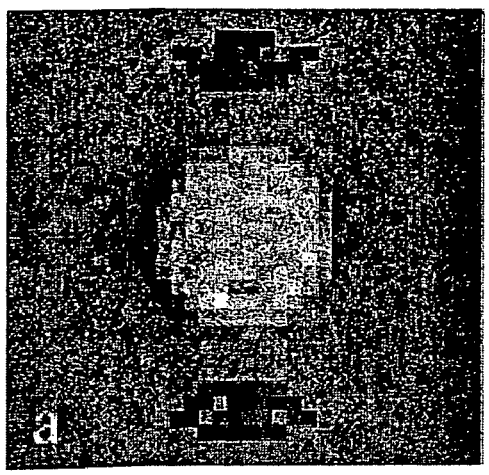
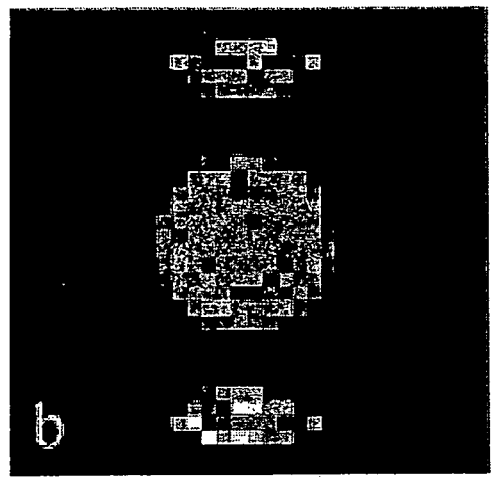
FIG 7
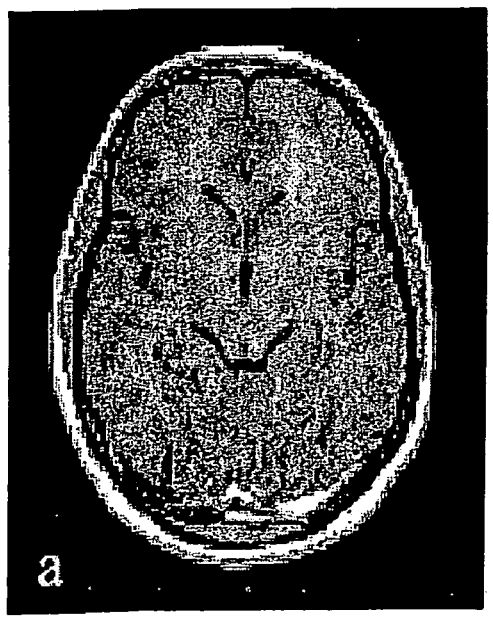
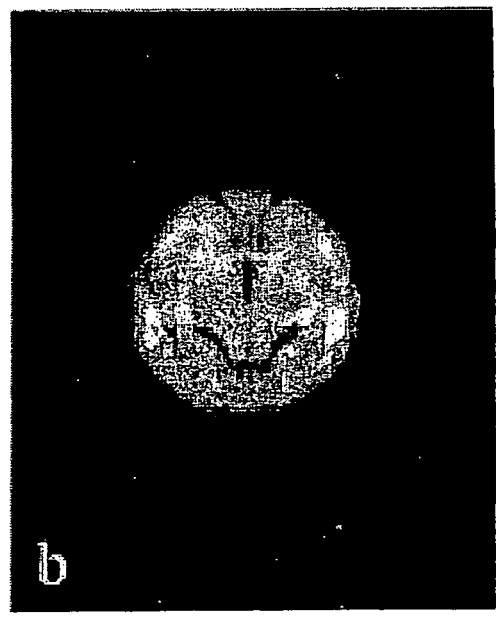

METHOD AND APPARATUS FOR IMPROVED TRANSMISSION-SIDE ACCELERATED PPA-BASED VOLUME-SELECTIVE MAGNETIC RESONANCE IMAGING

BACKGROUND OF THE INVENTION

1. Field of the Invention

The present invention generally concerns magnetic resonance tomography (MRT) as employed in medicine for examination of patients. The present invention in particular concerns a method as well as an MRT system for implementation of such a method making use of PPA based, partial parallel acquisition.

2. Description of the Prior Art

MRT is based on the physical phenomenon of nuclear magnetic resonance and has been successfully used as an imaging method for over 20 years in medicine and biophysics. In this examination modality, the subject is exposed to a strong, constant magnetic field. The nuclear spins of the atoms in the subject, which were previously randomly oriented, thereby align. Radio-frequency energy can now excite these "ordered" nuclear spins to a specific oscillation. In MRT, this oscillation generates the actual measurement signal, which is acquired by suitable reception coils. By the use of inhomogeneous magnetic fields generated by gradient coils, the measurement subject can be spatially coded in all three spatial directions. The method allows a free selection of the slice to be imaged, so slice images of the human body can be acquired in all directions. MRT as a tomographic imaging method in medical diagnostics is distinguished predominantly as a "non-invasive" examination method with a versatile contrast possibility. Due to the excellent ability to represent soft tissue, MRT has developed into a method superior in many ways to x-ray computed tomography (CT). MRT today is based on the application of spin echo and gradient echo sequences that enable an excellent image quality with measurement times in the range of seconds to minutes.

The acquisition of the data in MRT occurs in k-space (frequency domain). The MRT image in the image domain is linked with the MRT data in k-space by means of Fourier transformation. The spatial coding of the subject, which spans k-space, can occur in various manners; but a Cartesian or a per-projection sampling is the most common. The coding ensues by means of gradients in all three spatial directions.

The radio-frequency excitation of the subject can be made selective to the volume on the basis of similar spatial coding by the use of gradient fields during the excitation. The spatially-varying strength of the excitation, i.e. the flip angle dependent on the location, corresponds for small flip angles as a first approximation analogous to the reception case of the Fourier-transformed RF signal in transmission k-space. A temporally-efficient, volume-selective excitation was previously only possible in a spatial direction, i.e. in the form of slice selection, since the corresponding k-space trajectory corresponds to a single line in 3D k-space.

Multi-dimensional, volume-selective excitations require the spanning of multi-dimensional k-space trajectories. In a manner analogous to 2D and 3D phase coding in the reception case, this requires a great deal of time and prevents the application of volume-selective excitation, for example in spectroscopy or for homogenization of the flip angle distribution in intense field apparatuses.

The most effective methods for shortening the image measurement time for the reception of MR signals given Cartesian sampling are based on a reduction of the number of time-consuming phase coding steps $N_y$ and the use of a number of signal acquisition coils, known as a "partial parallel acquisition" and designated herein as PPA. This principle can be transferred to data acquisition methods with radial or spiral-shaped sampling, by reducing the number of time-consuming angle steps $N_\varphi$ or the number or the length of the spiral arms. In the following, a Cartesian k-space sampling is considered without limitation of the generality in the transmission and reception case. In order to differentiate between transmission and reception k-space trajectories, the former is designated with the symbol κ (kappa).

The fundamental idea in conventional, reception-side PPA imaging is that the k-space data are not acquired by a single coil, but rather by component coils arranged linearly, annularly or matrix-like around the subject, for example in the form of a coil array. As a result of their geometry, each of the spatially-independent coils of the array supplies certain spatial information which is used in order to achieve a complete spatial coding by a combination of the simultaneously-acquired coil data. This means that a number of "omitted" lines in k-space can also be determined from a single acquired k-space line.

Receiver-side PPA methods thus use spatial information that is contained in the signals from the components of a coil arrangement in order to partially replace the time-consuming relaying of the phase coding gradient. The image measurement time is thereby reduced corresponding to the ratio of number of the lines of the reduced data set to the number of the lines of the conventional (thus complete) data set. In comparison to the conventional acquisition, in a typical PPA acquisition only a fraction (½, ⅓, ¼, etc.) of the k-space lines are acquired. A special reconstruction is then applied to the k-space data in order to reconstruct the missing lines, and thus to obtain the full field of view (FOV) image in a fraction of the time. The FOV is established according to the factor 2π/k by the size of k-space under consideration.

Established PPA methods for Cartesian data acquisition such as SENSE or GRAPPA make use of the Fourier shift theorem, whereby an additional phase $\Delta k_y$ y is impressed on the nuclear magnetic resonance signal along the phase coding direction by a combination of the individual coil signals. New $k_y$ lines that no longer have to be explicitly measured thus arise in the frequency domain, so the measurement time is reduced.

In all PPA methods, additional calibration data points are necessarily also acquired (additionally measured central reference lines) that are added to the actual measurement data, and a reduced data set can actually be completed again only on the basis of such calibration data points.

Recently, transmitter-side PPA imaging methods have also been suggested that additionally enable an accelerated volume-selective excitation. A number of simultaneously-operated transmission coils are required for this that, are arranged around the subject to be examined to form a PPA transmission coil array. Transmission coil-side acceleration is achieved (analogous to the accelerated receiver-side PPA data acquisition along an under-sampled reception trajectory in reception k-space) by the excitation of the region to be examined in transmission k-space ensuing along under-sampled transmission trajectories, but which generate an excitation profile that corresponds to that of the complete transmission trajectory. For this purpose, individually-determined RF pulse shapes must be used in the individual elements of the transmission coil array. One possibility for this determination is described in "Transmit SENSE" (U. Katscher, P. Bornert, C. Leussler, J S. van den Brink, "Transmit SENSE", Magnetic Resonance in Medicine, 2003 January; 49(1): 144-150) and exhibits parallels to the receiver-side SENSE method. It has the disadvantage that the sensitivity profiles of all participating transmission coils (transmission coil sensitivities) must be known. The measurement-technical determination of these transmission sensitivities represents a central problem since these cannot be measured independent of the reception sensitivities. Even given the use of the same radio-frequency coils for excitation and for reception, it cannot be assumed that the transmission coil sensitivities and the receiver coil sensitivities are identical, since the transmission field and the reception field differ significantly, in particular at high field strengths.

SUMMARY OF THE INVENTION

It is an object of the present invention to provide a method and an apparatus for implementation of the method in order to improve the efficiency (performance) of the accelerated, volume-selective excitation, that operate without knowledge of the coil sensitivities and thus, without a need to explicitly determine this information, in particular given the use of various coil arrays in the transmission and reception case.

This object is achieved according to the invention by a method for determination of transmission coil-specific RF excitation pulses for a transmission coil array for accelerated PPA-based volume-selective excitation of a tissue region of a patient to be examined with a magnetic resonance tomography apparatus having a basic field magnet, a gradient coil system, a transmission coil array and a reception coil array, that includes the following steps:

a) radiation, via a first coil of the coil array, of a first series of volume-selective RF excitation pulses along a first transmission trajectory in transmission κ-space, which first transmission trajectory is reduced on the basis of an acceleration factor AF, b) reception of the magnetic resonance response signals (generated by this first RF excitation) from the excited tissue region along a complete reception trajectory in reception k-space with all coils of the reception coil array simultaneously, c) repetition of the steps a) and b) in succession with all further coils of the transmission coil array, d) simultaneous radiation by all coils of the transmission coil array of a second series of volume-selective RF excitation pulses along a further reduced transmission trajectory in transmission κ-space, and e) reception of the magnetic resonance response signals (generated by this second RF excitation) from the excited tissue region along the same complete reception trajectory in reception k-space with all coils of the reception coil array simultaneously, f) in the case of AF>2, repetition of the steps d) and e) until the entirety of all reduced transmission trajectories forms a complete transmission trajectory, g) determination of combination coefficients on the basis of all measured response signals, h) calculation (on the basis of the determined combination coefficients) of transmission coil-specific RF excitation pulses that generate a desired excitation profile given simultaneous radiation along the first reduced transmission trajectory by multiple or all coils of the transmission coil array.

The complete transmission trajectory and the complete reception trajectory can be equal.

Alternatively, transmission trajectory and reception trajectory can be different, but inventively exhibit a geometric relation in their k-space coordinates that enables a calculation of combination coefficients on the basis of the reception trajectory and an application of these combination coefficients on the basis of the first transmission trajectory.

The transmission trajectory and/or reception trajectory in k-space preferably have a Cartesian form or, but the transmission trajectory and/or reception trajectory can be fashioned radially or, helically in k-space.

A single coil array can be used as the transmission coil array and the reception coil array, i.e. the transmission coil array and the reception coil array are one and the same.

The above object also is achieved in accordance with the invention by a method based on measured or estimated transmission coil sensitivities of the transmission coil array for determination of transmission coil-specific RF excitation pulses for a transmission coil array for accelerated PPA-based, volume-selective excitation of a tissue region of a patient to be examined with a magnetic resonance tomography apparatus having a basic field magnet, a birdcage structure, a transmission coil array and a reception coil array, that includes the following steps:

a) measurement or estimation of the transmission sensitivities of the transmission coil array, b) generation of virtual calibration measurement values on the basis of the transmission coil sensitivities, both for each individual coil of the coil array along a first transmission trajectory reduced on the basis of an acceleration factor AF and for a combination of the coils of the transmission coil array along AF−1 further reduced transmission trajectories, c) determination of combination coefficients on the basis of the virtual calibration measurement values, and d) calculation of transmission coil-specific RF excitation pulses on the basis of the determined combination coefficients that, given simultaneous radiation along the first reduced transmission trajectory by multiple or all coils of the transmission coil array, generate a desired excitation profile.

In this method just described, it is can be advantageous for the transmission trajectory in k-space to have Cartesian form, or the transmission trajectory can be radial or helical in k-space.

The above object also is achieved in accordance with the present invention by a magnetic resonance apparatus that implements the method described above.

The above object also is achieved by a computer software product, in the form of a storage medium encoded with computer-readable data, loadable into a control computer or image reconstruction computer of a magnetic resonance apparatus, that programs the control computer or the image reconstruction computer to operate in a manner to implement the method described above.

DESCRIPTION OF THE DRAWINGS

FIG. 2A schematically shows a (one-dimensional) slice-selective excitation.

FIG. 2B schematically shows a (two-dimensional) volume-selective excitation.

FIG. 3 schematically shows the transmission of one coil of a PPA transmission coil array along a first reduced transmission trajectory and, associated with this, the simultaneous reception with all reception coils of the PPA reception coil array.

FIG. 4 schematically shows the simultaneous transmission of all coils of a PPA transmission coil array along a second and a third reduced transmission trajectory and, associated with this, the simultaneous reception with all reception coils of the PPA reception coil array.

FIG. 5 schematically shows the simultaneous transmission of all coils of a PPA transmission coil array with the RF excitation pulses determined on the basis of the inventive calibration method, which transmission leads to an excitation along the first reduced transmission trajectory while retaining the desired volume-selective excitation profile.

FIG. 6 shows the real part of a first and a second reduced transmission trajectory for AF=2.

FIG. 7 shows a slice of the subject with homogeneous excitation (left) and with accelerated selective excitation (right).

DESCRIPTION OF THE PREFERRED EMBODIMENTS

Figure 1:
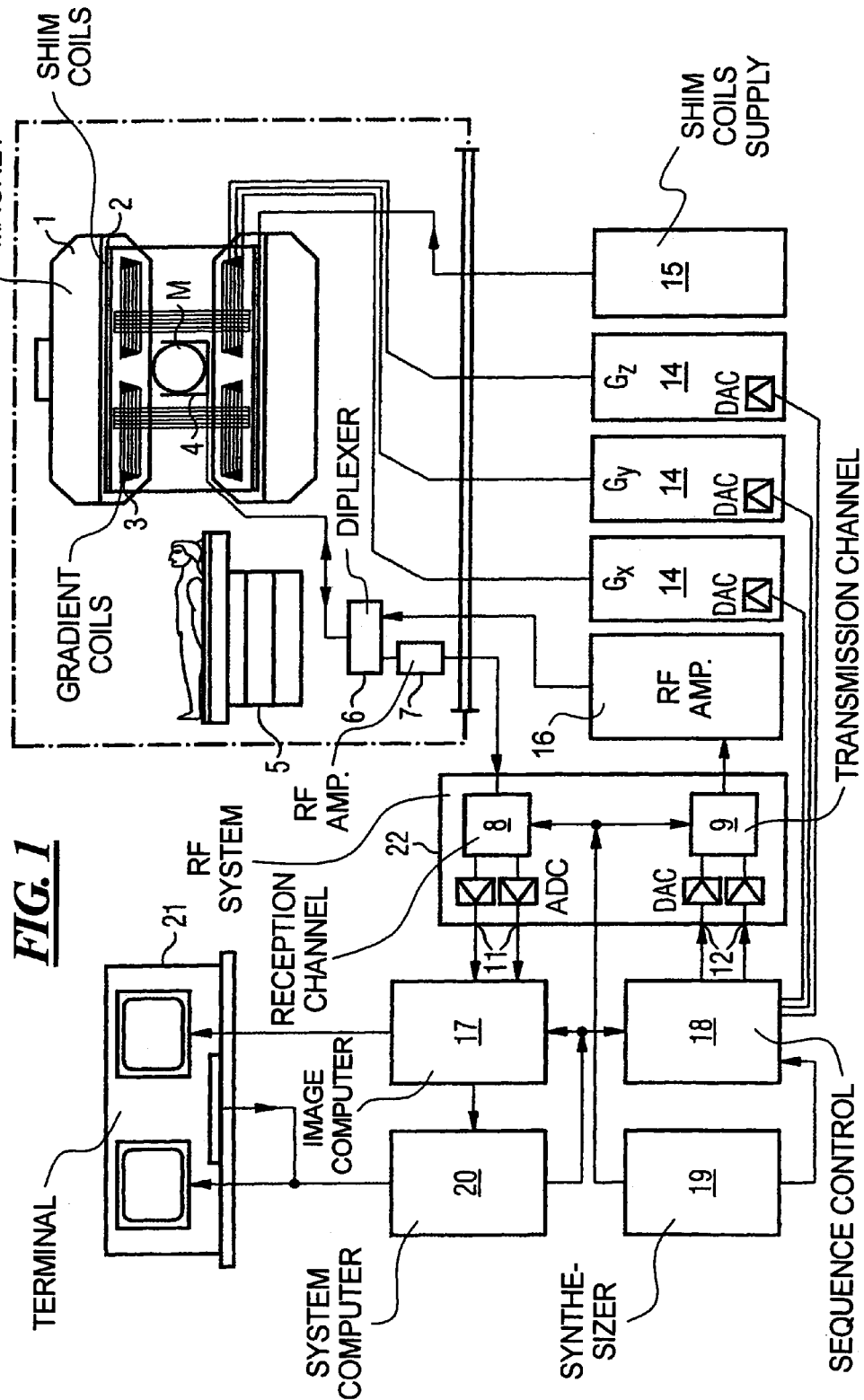
FIG. 1 is a schematic block diagram of an inventive MRT apparatus for implementation of the inventive method.

FIG. 1 is a schematic illustration of a magnetic resonance imaging or magnetic resonance tomography apparatus for generating a magnetic resonance image of a subject according to the present invention. The design of the magnetic resonance tomography apparatus thereby corresponds to that of a conventional magnetic resonance tomography apparatus, with the differences identified below. A basic field magnet 1 generates a temporally-constant strong magnetic field for polarization or alignment of the nuclear spins in the examination region of a subject such as, for example, of a part of a human body to be examined. The high homogeneity of the basic magnetic field necessary for the magnetic resonance measurement is defined in a spherical measurement volume V in which the parts of the human body to be examined are introduced. To support the homogeneity requirements, and in particular for elimination of temporally invariable influences, shim plates made of ferromagnetic material are mounted at a suitable location. Temporally variable influences are eliminated by shim coils 2 that are activated by a shim power supply 15.

A gradient coil system 3 is composed of a number of windings (sub-windings) is disposed in the basic field magnet 1. Each sub-winding is supplied with current by an amplifier for generation of a linear gradient field in the respective directions of the Cartesian coordinate system. The first sub-coil of the gradient coil system 3 thereby generates a gradient Gx in the x-direction, the second sub-coil generates a gradient Gy in the y-direction and the third sub-coil generates a gradient Gz in the z-direction. Each amplifier includes a digital-analog converter that is activated by a sequence controller 18 for time-accurate generation of gradient pulses.

Located within the gradient coil system 3 is a radio-frequency antenna 4 that converts the radio-frequency pulses emitted by a radio-frequency power amplifier into an alternating magnetic field for excitation of the nuclei and alignment of the nuclear spins of the subject to be examined or of the region of the subject to be examined. The radio-frequency antenna 4 includes one or more RF transmission coils and a number of RF reception coils in the form, for example, of a linear array of component coils in PPA imaging systems. The alternating field originating from the precessing nuclear spins (i.e. normally the nuclear spin echo signals caused by a pulse sequence composed of one or more radio-frequency pulses and one or more gradient pulses) is also converted by the RF reception coils of the radio-frequency antenna 4 into a voltage that is supplied via an amplifier 7 to a radio-frequency reception channel 8 of a radio-frequency system 22. The radio-frequency system 22 furthermore has a transmission channel 9 in which are generated the radio-frequency pulses for excitation of the magnetic resonance. The respective radio-frequency pulses are thereby digitally represented in the sequence controller 18 as a series of complex numbers based on a pulse sequence predetermined by the system computer 20. The real and imaginary parts of this number series are respectively supplied via inputs 12 to a digital-analog converter in the radio-frequency system 22, and from this to a transmission channel 9. In the transmission channel 9, the pulse sequences are modulated with a radio-frequency carrier signal having a base frequency that corresponds to the resonance frequency of the nuclear spins in the measurement volume.

The switch-over from transmission to reception operation ensues via a transmission-reception diplexer 6. The RF transmission coil of the radio-frequency antenna 4 radiates the radio-frequency pulses for excitation of the nuclear spins into the measurement volume V for excitation of the nuclear spins and samples resulting echo signals via the RF reception coils. The correspondingly-acquired magnetic resonance signals are phase-sensitively demodulated in the reception channel 8 of the radio-frequency system 22 and translated into a real part and an imaginary part of the measurement signal via respective analog-digital converters. An image is reconstructed by an image computer 17 from the measurement data acquired in this manner. The administration of the measurement data, the image data and the control programs ensues via the system computer 20. Based on requirements set by control programs, the sequence controller 18 monitors the generation of the respective desired pulse sequences and the corresponding sampling of k-space. The sequence controller 18 in particular controls the time-accurate switching of the gradients, the emission of the radio-frequency pulses with defined phase and amplitude and the reception of the magnetic resonance signals. The time base for the radio-frequency system 22 and the sequence controller 18 is provided by a synthesizer 19. The selection of suitable control programs for generation of a magnetic resonance image as well as the representation of the generated magnetic resonance image ensues through a terminal (console) 21 that has a keyboard as well as one or more display screens.

In order to be able to implement transmission-side and reception-side PPA measurements with an MRT apparatus, it is necessary (particularly in the phase coding direction (y-direction)) to not use an individual coil but rather to use an arrangement composed of a number of transmission and reception coils. These coils, what are known as component coils, are respectively connected to form a transmission coil array and a reception coil array, with the coils of both arrays being arranged mutually adjacent or overlapping and interleaved. The spatial arrangement of the component coils is extremely complex. So that the coils of a coil array can excite individually, each transmission coil requires hardware including a device for modulation, for example its own damping element adjustable in real time or its own transmitter including a digital-analog converter, frequency modulator and RF amplifier. For individual reception, each reception coil requires its own receiver, including a preamplifier, mixer and analog-digital converter.

The inventive method makes use of an auto-calibration method such as GRAPPA in order to improve the performance, particularly for accelerated, volume-selective excitations, without having to explicitly determine or estimate the transmission coil sensitivities.

In the simplest case, volume-selective excitation is achieved by activating a constant slice-selection gradient during the radiation of, for example, an RF pulse having the form (shape) of a sine pulse. The constant gradient translates the sinc-shaped RF pulse into k-space. The excitation thus produces an approximately-rectangular slice profile in the spatial domain (FIG. 2A) which, for example, corresponds to the slice of interest of a patient to be examined. In the general case, an arbitrarily-shaped excitation profile is desired, which is attained by using one or more RF excitation pulses along a multi-dimensional transmission trajectory in κ-space. The κ-space function thereby determined again approximately corresponds to the Fourier-transformation of the desired excitation profile. The κ-space trajectory can be predetermined by suitable gradient switching (activating), analogous to imaging sequences (for example echo-planar imaging, EPI). (The use of a 2D sinc-function, for example, would result in a rectangular excitation profile in the spatial domain in the projection—FIG. 2B.)

The purpose of such a volume-selective excitation can differ and, for example, can be to excite only selected regions in varying spectroscopic MR experiments or even to vary the strength of the excitation spatially via variation of the flip angle in conventional MRT imaging in order, for example, to improve the homogeneity of the RF excitation given higher flux densities (for example >3 Tesla).

Just as a (in the general case) three-dimensional k-space trajectory takes a very large amount of time in the reception case, such a volume-selective excitation in the transmission κ-space also requires a correspondingly large amount of time for excitation of the desired slice profile. The goal of known methods (for example Transmit SENSE) is to transfer the receiver-side PPA imaging to the transmission case as is briefly shown in the following:

In general, transmission-side PPA imaging techniques achieve accelerations in that under-sampled excitation trajectories are used (and in fact with a transmission coil array) during a corresponding modulation of the RF signals in the individual transmission elements in order to obtain the same excitation profile.

A magnetic resonance tomography apparatus is assumed which, aside from the basic field magnet and the gradient coil system, also has (among other things) a PPA transmission coil array composed of C coils as well as a PPA reception coil array composed of D coils. In order to achieve a transmission-side, accelerated, PPA-based, volume-selective excitation of the tissue region of a patient to be examined, the following steps are conventionally undertaken:

simultaneous radiation of a number C of volume-selective RF excitation pulses along a transmission trajectory in transmission κ-space by the respective coils of the PPA transmission coil array, simultaneous acquisition of the magnetic resonance response signal from the excited tissue region along a readout trajectory in reception k-space by the respective coils of the PPA reception coil array, and generation of images of the tissue region in the spatial domain via transformation of the measurement data from reception k-space into the spatial domain.

The volume-selective RF excitation pulses are different in all transmission coils and use a transmission trajectory which represents an under-sampled part of that trajectory that would be used given a conventional volume-selective excitation. In Transmit SENSE, the coil-specific RF excitation pulses must be algebraically determined on the basis of the transmission coil sensitivities, but the determination of the sensitivity profiles of the transmission coils is problematic.

For this reason, the inventive approach is to algebraically form the missing segments of under-sampled (reduced) excitation trajectories (transmission trajectories) in the form of linear combinations of the RF excitation pulses along a single segment without having to explicitly use the transmission coil sensitivities, in the manner of GRAPPA, in which the algebraic reconstruction of non-measured k-space lines ensues on the basis of a determined combination coefficient matrix. The inventive method is therefore designated as "Transmit GRAPPA". In the inventive method Transmit GRAPPA, missing κ-space segments are expressed in the form of linear combinations of an individual κ-space segment on the basis of calibration data. The RF excitation pulse of each coil is then in turn provided via a linear combination of the segments of a conventional volume-selective RF pulse according to the equation below.

In order to illustrate this, the conventional GRAPPA method should be explained briefly in the following:

In order to optimize the quality of the reconstruction of an undersampled k-space trajectory and the SNR, a reconstruction according to GRAPPA again generates a number N of data sets (coil images) from, for example, a number N of incompletely-measured data sets (except for the additionally-measured central reference lines, under-sampled coil images; coil 1 through coil N), which N data sets are—always still in k-space—respectively, separately completed again. A Fourier transformation of the individual coil images thus leads to N convolution-free individual coil images whose combination in the spatial domain (for example by means of sum-of-squares reconstruction) leads to an image optimized with regard to SNR and signal obliteration.

The GRAPPA reconstruction, which again leads to N complete individual coil data sets given N component coils, is based on a linear combination of the measured lines of an incomplete data set, whereby the determination of the (linear) coefficients necessary for this is emphasized. For this it is attempted to linearly combine the regular measured (thus not omitted) lines of an incomplete data set such that with them the additionally-measured reference lines (thus the calibration data points) can be fitted optimally well. The reference lines thus serve as target functions that can be adapted better the more regular measured lines exist, possibly distributed among incomplete data sets of different component coils.

This means that, in the framework of a GRAPPA reconstruction, the incomplete data sets of N component coils must in turn be mapped to the N component coils to complete these data sets. This "mapping" ensues algebraically via a vector matrix multiplication, whereby the vectors represent the regular measured k-space lines and the matrix represents the determined combination coefficient matrix. In other words, this means that: if a linear combination of measured lines on the basis of a coefficient matrix results in a good approximation of the reference lines (calibration data points), omitted (and thus not measured) lines of equal number can likewise be reconstructed well with this matrix. The coefficients are often also designated as weighting factors; the reference lines carry information about the coil sensitivities.

In the following it is shown that auto-calibration methods such as GRAPPA can be used in order to improve the performance of accelerated volume-selective excitations without having to explicitly determine the transmission sensitivities.

$T_c(\vec{x})$ is the modulation of a subject magnetization $M(\vec{x})$ caused by an RF excitation pulse $\sigma(\vec{\kappa})$ in the coil c with c=1 . . . C, whereby $\vec{x}$ is the spatial coordinates and $\vec{\kappa}$ is the spatial frequency coordinate of the spatial excitation in transmission κspace. The spatial frequency representations of these fields are respectively designated with lowercase letters, $m(\vec{k})$ as well as $t_c(\vec{k})$, whereby $\vec{k}$ represents the coordinate of the spatial frequency in reception k-space.

A component coil array is also assumed composed D receiver coils with coil sensitivity profiles $R_d(\vec{x})$ or $r_d(\vec{k})$ with d=1 . . . D and an acceleration factor AF. A division of the transmission k-space trajectory $\sigma(\vec{\kappa})$ into a number of AF segments $\sigma^n(\vec{\kappa})$ of the RF excitation with n=1 . . . AF thus ensues, essentially analogous to the case of the parallel imaging in the reception case, for example the omission of AF−1 κ-spacelines for each transmitted line in a Cartesian experiment. The modulation of the magnetization caused by $\sigma^n(\vec{\kappa})$ in the coil c can then be written according to the following: $T_c^n(\vec{x})$ or $t_c^n(\vec{k})$.

Furthermore, it is assumed that $\sigma(\vec{\kappa})$—when it is simultaneously used for all transmission elements—causes a homogeneous combined excitation or a corresponding modulation $T^n(\vec{x})$ for an individual segment and $T(\vec{x})$ for all segments (designated in the k-space representation with $t^n(\vec{k})$ and with $t(\vec{k})$), respectively provided by $$T^n(\vec{x}) = \sum_{c=1}^{C} T_c^n(\vec{x}), \quad (1a, 1b)$$

$$T(\vec{x}) = \sum_{n=1}^{AF} T^n(\vec{x})$$

The signal $s_{c,d}^n(\vec{k})$ acquired in the receiver coil d after radiation of $\sigma^n(\vec{\kappa})$ by the transmission coil c (without consideration of the relaxation) can then be written according to the following:

$$s_{c,d}^n(\vec{k}) = m(\vec{k}) \otimes t_c^n(\vec{k}) \otimes r_d(\vec{k}) \quad (2)$$

wherein $\otimes$ represents the convolution operator in k-space.

In order to determine the desired signal curve of that RF excitation pulse that, in the C transmission coils, simultaneously leads to the complete desired excitation sent along the n=1 κ-space excitation trajectory, the following inventive procedure is exemplarily proposed for a 2D excitation:

individual transmission of $\sigma^n(\vec{\kappa})$ with each coil along the segment n=1 and simultaneous acquisition of the data $s_{c,d}^1(\vec{k})$ with all receiver coils along the same k-/κ-space trajectory of the excitation simultaneous transmission of $\sigma^n(\vec{\kappa})$ with all transmission coils individually along the other segments of the RF trajectory n=2 . . . AF and simultaneous acquisition of the data $s_{c,d}^n(\vec{k})$ with all receiver coils according to $$s_{c,d}^n(\vec{k}) = m(\vec{k}) \otimes t^n(\vec{k}) \otimes r_d(\vec{k}) \quad (3)$$

determination of the scalar coefficients (combination coefficients) $f_c^{1 \to n}(p,q)$, n=2 . . . AF such that the following condition is fulfilled $$\sum_{c=1}^{C} \sum_{p,q} f_c^{1 \to n}(p, q) \cdot s_{c,d}^1(\vec{k} - p \cdot AF \cdot \Delta \vec{k}_y - q \cdot \Delta \vec{k}_s) = s_d^n(\vec{k}) \quad (4)$$

for example for p∈[−1 . . . 1] and q∈[−2 . . . 2].

During the accelerated excitation, the transmission ensues with all coils c=1 . . . C simultaneously along the trajectory n=1, wherein $$\sigma_c^1(\vec{\kappa}) = \sum_{n=1}^{AF} \sum_{p,q} f_c^{1 \to n}(p, q) \cdot \sigma^1(\vec{\kappa} - p \cdot AF \cdot \Delta \vec{\kappa}_y - q \cdot \Delta \vec{\kappa}_s) \quad (5)$$

using the same ranges for p and q as for equation (4). It is noted that in this example the same trajectory was used without limitation of the generality for transmission and reception. Other specifications of the linear combinations in equation (4) or (5) are also possible without limitation as to generality.

The inventive procedure is illustrated using FIGS. 3 through 5:

In FIG. 3, a transmission coil array composed of four transmission coils uniformly arranged around a circular subject to be examined is shown in the upper left. The arrows directed inwards towards the subject symbolize the capability for transmission or for irradiation of RF excitation pulses into the subject. A reception coil array comprising two reception coils arranged around the same subject is shown on the right side of FIG. 3. The arrows directed outwardly symbolize the capability for reception of magnetic resonance response signals that exit from the subject after an RF excitation by the transmission coils.

For the moment, the first step of the inventive method has two sub-steps, and begins with transmission of an RF pulse series $\sigma(\vec{\kappa})$ by the first of the transmission coils that effects an RF excitation along a first reduced transmission trajectory (n=1) in transmission κ-space. The transmitting coil is shown in black and marked by a circle; the transmission is symbolized by a white arrow. The reduced transmission trajectory (to the right of the transmission coil array) is shown two-dimensionally in a coordinate system in the transmission κ-space. For the RF excitation, an acceleration factor of AF=3 was selected as is apparent from the two dashed κ-space lines omitted in the $\kappa_y$-direction. This first reduced transmission trajectory is designated with n=1.

The second sub-step is measurement or acquisition of the response signal (initiated by the RF excitation in the subject) in reception k-space by all coils of the reception coil array. The acquisition ensues simultaneously in all reception coils (i.e. at the same time; symbolized by the white arrows pointing outwards) along a complete (non-reduced) acquisition trajectory that (on the right side in FIG. 3) is shown two-dimensionally in a coordinate system in acquisition k-space. This reception data set in the reception coil d=1 caused by the RF excitation of the transmission coils c=1 along the reduced transmission trajectory n=1 is designated with $s_{c=1,d=1}^{n=1}(\vec{k})$ The reception data set of the reception coil d=2 is designated with $s_{1,2}^1(\vec{k})$.

Both sub-steps are now repeated corresponding to the number of the transmission coils (see, for example, lower half of FIG. 3: transmission of the second transmission coil) until corresponding reception data sets have been acquired for each transmission coil, whereby the (reduced) transmission trajectory as well as the reception trajectory always remain the same. Given four transmission coils and two reception coils, a total of eight reception data sets is thus acquired in four transmission-reception cycles: $s_{1,1}^1(\vec{k})$, $s_{1,2}^1(\vec{k})$, $s_{2,1}^1(\vec{k})$, $s_{2,2}^1(\vec{k})$, $s_{3,1}^1(\vec{k})$, $s_{3,1}^2(\vec{k})$, $s_{4,1}^1(\vec{k})$ and $s_{4,2}^1(\vec{k})$.

The second step of the inventive method is shown in FIG. 4, in which, in a first sub-step, all transmission coils simultaneously effect an RF excitation, along a second reduced transmission trajectory (n=2) that preferably does not overlap with the first reduced transmission trajectory (n=1) from step 1. This second transmission trajectory is shown in a circle in the upper part of FIG. 4 to the right of the transmission coil array. For this excitation, corresponding reception data sets are again simultaneously acquired in all reception coils. This second step is repeated until all reduced transmission trajectories n=1 through AF taken together result in a complete transmission trajectory. For AF=3 and a reception coil array with two coils, in two further transmission-reception cycles this in total delivers four further reception data sets $s_{d=1}^{n=2}(\vec{k})$, $s_2^2(\vec{k})$, $s_1^3(\vec{k})$ and $s_2^3(\vec{k})$ (the c-indexing was omitted since in this step all C transmission coils are simultaneously participating).

Finally, from the reception data sets of the steps 1 and 2 a system of equations analogous to GRAPPA is assembled which enables the determination of combination coefficients $f_c^{1\rightarrow n}(p,q)$ which map the measurement data from step 1 to the measurement data from step 2. With the aid of these combination coefficients (which are, in a certain regard, comparable with the coefficients of a GRAPPA reconstruction matrix), those transmission pulse-specific RF excitation pulses are in turn calculated that (transmitted simultaneously from all coils) yield the reduce transmission trajectory n=1, and effect an excitation according to the desired excitation profile. These algebraically-determined RF excitation pulses are given in FIG. 5 as $\sigma_1^1(\vec{k})$, $\sigma_2^1(\vec{k})$, $\sigma_3^1(\vec{k})$ and $\sigma_4^1(\vec{k})$.

Given application of the GRAPPA auto-calibration approach, only a few k-space lines must be acquired on the receiver side in the calibration phase. A simulation for this is shown in FIG. 6 in which the images for calibration purposes with an acceleration factor AF=2 given use of an 8-element birdcage array for transmission are shown with low resolution (left image n=1, right image n=2). In this case, data matrices of the size 32×32 are used in order to determine the linear combination coefficients. As can be seen from FIG. 7 (left image non-selective), given accelerated selective excitation the resulting profile corresponds very well to the desired (selected) circular profile (right image).

Although the auto-calibration approach just described clearly offers advantages relative to methods that operate with explicitly or approximately determined transmission sensitivities, the determination and application of the combination coefficients used is also possible on the basis of explicitly determined or, respectively, suitably estimated transmission sensitivities. Namely, the equivalent variables for $s_{c,d}^n(\vec{k})$ or for $s_{c,d}^1(\vec{k})$ and $s_d^n(\vec{k})$ can be calculated easily and at any time from the transmission sensitivities.

This is, for example, possible in that the Fourier-transformed [sic] of the transmission coil sensitivities of individual transmission coils, evaluated on the first reduced transmission trajectory, is identified with $s_c^1(\vec{k})$, (without the influence of the reception coil array), and the Fourier-transformation of a combination of all transmission coil sensitivities, evaluated on the remaining reduced transmission-trajectories, is identified with $s^1(\vec{k})$. These quantities can then be understood as virtual calibration measurement values.

It is likewise possible to simulate a calibration experiment as described above on the basis of the reception coil sensitivities of the used reception coil array or an arbitrary assumed reception coil array, in order to thus obtain virtual measurement values $s_{c,d}^1(\vec{k})$ and $s_d^n(\vec{k})$.

The determination and application of the combination coefficients then occurs in a manner wholly analogous to the method described above.

In summary the invention represents a simple rule (based on the GRAPPA formalism) for determination of multi-dimensional RF pulses using parallel transmission. On the basis of this concept it is possible to derive the RF pulses for the individual coils (using an auto-calibration approach), such that an absolute quantification of the transmission profiles of the individual coils (as present methods require it) is no longer necessary. All that is necessary for a coil design of C transmission coils is merely C acquisitions in which a reduced transmission trajectory is sent with an individual coil, followed by AF–1 further acquisitions in which the remaining reduced trajectories are sent. Acquisition is done with all reception coils. Since all of these acquisitions can be low-resolution experiments, this process should be quick and can therefore be simply repeated for different slice positions or RF pulse curves. This should be particularly be helpful in the case of high field strengths in which the profiles of the transmission fields significantly differ from those of the reception fields and are sensitive with regard to charge variations during the scan.

In the event that a measurement or estimation of the transmission coil sensitivities nevertheless is accurate, the described approach can also be used for calculation of the transmission coil-specific RF pulses on the basis of these transmission coil sensitivities.

Although modifications and changes may be suggested by those skilled in the art, it is the intention of the inventors to embody within the patent warranted hereon all changes and modifications as reasonably and properly come within the scope of their contribution to the art.

We claim as our invention:

1. A method for determining transmission coil-specific RF excitation pulses for respective component coils of a transmission coil array for accelerated, PPA-based, volume-selective excitation of a tissue region of a patient in a magnetic resonance tomography apparatus, said magnetic resonance tomography apparatus comprising a basic field magnet that generates a static magnetic field in the apparatus, a gradient coil system that generates gradient magnetic fields in the apparatus, said transmission coil array comprising a plurality of component coils, and a reception coil array comprising a plurality of component coils, said method comprising the steps of:

(a) radiating, from a first of said component coils of said transmission coil array, a first series of volume-selective RF excitation pulses along a first transmission trajectory in transmission κ-space, said first transmission trajectory being reduced by an acceleration factor AF;

(b) receiving magnetic resonance signals, produced in said tissue region of the patient in response to said first series of volume-selected RF excitation pulses, along a complete reception trajectory in reception k-space with all component coils of said reception coil array simultaneously;

(c) repeating steps (a) and (b) in succession for all further of said component coils of said transmission coil array;

(d) simultaneously radiating, from all of said component coils of said transmission coil array, a second series of volume-selective RF excitation pulses along a second reduced transmission trajectory in transmission κ-space;

(e) receiving magnetic resonance signals, produced in said tissue region of the patient in response to said second series of volume-selective RF excitation pulses, along the same complete reception trajectory in reception k-space with all of said component coils of said reception coil array simultaneously;

(f) for AF>2, repeating steps (d) and (e) until all of said reduced transmission trajectories in transmission κ-space form a complete transmission trajectory in transmission κ-space;

(g) automatically electronically determining combination coefficients dependent on all of the received magnetic resonance signals; and (h) from said combination coefficients, automatically electronically calculating transmission coil-specific RF excitation pulses for the respective component coils of the transmission coil array that generate a selected excitation profile for said tissue region by simultaneous radiation of said transmission coil-specific RF excitation pulses along said reduced first transmission trajectory by multiple component coils of said transmission coil array.

2. A method as claimed in claim 1 wherein step (h) comprises:

from said combination coefficients, automatically electronically calculating transmission coil-specific RF excitation pulses for the respective component coils of the transmission coil array that generate a selected excitation profile for said tissue region by simultaneous radiation of said transmission coil-specific RF excitation pulses along said reduced first transmission trajectory by all component coils of said transmission coil array.

3. A method as in claim 1, wherein said complete transmission trajectory in transmission κ-space is identical to said complete reception trajectory in reception k-space.

4. A method as claimed in claim 1 wherein said complete transmission trajectory in transmission κ-space is defined by κ-space coordinates and wherein said complete reception trajectory in reception k-space is defined by k-space coordinates, and wherein said complete transmission trajectory is different from said complete reception trajectory but which exhibits a geometric relation of said κ-space coordinates thereof to the k-space coordinates of said complete reception trajectory, and wherein step (g) comprises determining said combination coefficients based on said complete reception trajectory and said geometric relation.

5. A method as claimed in claim 1 wherein said complete transmission trajectory has a Cartesian form in transmission κ-space and wherein said complete reception trajectory has a Cartesian form in reception k-space.

6. A method as claimed in claim 1 wherein said complete transmission trajectory is selected from the group consisting of radial trajectories and helical trajectories in transmission κ-space, and wherein said complete reception trajectory is selected from the group consisting of radial trajectories and helical trajectories in reception k-space.

7. A method as claimed in claim 1 comprising employing a single coil array as both said transmission coil array and said reception coil array.

8. A magnetic resonance tomography apparatus comprising:

a basic field magnet that generates a static magnetic field in an examination volume adapted to receive a patient therein;

a gradient coil system that generates gradient magnetic fields in the examination volume;

a transmission coil array comprising a plurality of component coils;

a reception coil array comprising a plurality of component coils;

a control unit configured to operate said transmission coil array and said reception coil array to (a) radiate, from a first of said component coils of said transmission coil array, a first series of volume-selected RF excitation pulses along a first transmission trajectory in transmission κ-space, said first transmission trajectory being reduced by an acceleration factor AF, and to (b) receive magnetic resonance signals, produced in said tissue region of the patient in response to said first series of volume-selected RF excitation pulses, along a complete reception trajectory in reception k-space with all component coils of said reception coil array simultaneously, and to repeat (a) and (b) in succession for all further of said component coils of said transmission coil array;

said control unit further configured to operate said transmission coil array and said reception coil array to (c) simultaneously radiate, from all of said component coils of said transmission coil array, a second series of volume-selective RF excitation pulses along a second reduced transmission trajectory in transmission κ-space, and to (d) receive magnetic resonance signals, produced in said tissue region of the patient in response to said second series of volume-selective RF excitation pulses, along the same complete reception trajectory in reception k-space with all of said component coils of said reception coil array simultaneously, and, for AF>2 to repeat (c) and (d) until all of said reduced transmission trajectories in transmission κ-space form a complete transmission trajectory in transmission κ-space; and an image reconstruction computer configured to automatically electronically determine combination coefficients dependent on all of the received magnetic resonance signals, and from said combination coefficients, further configured to automatically electronically calculate transmission coil-specific RF excitation pulses for the respective component coils of the transmission coil array that generate a selected excitation profile for said tissue region by simultaneous radiation of said transmission coil-specific RF excitation pulses along said reduced first transmission trajectory by multiple component coils of said transmission coil array.

9. A computer readable medium encoded with data and loadable into a computer arrangement of a magnetic resonance tomography apparatus, said magnetic resonance tomography apparatus comprising a basic field magnet that generates a static magnetic field in the apparatus, a gradient coil system that generates gradient magnetic fields in the apparatus, a transmission coil array comprising a plurality of component coils, and a reception coil array comprising a plurality of component coils, said data programming said computer arrangement to determine transmission coil-specific RF excitation pulses for respective component coils of said transmission coil array for accelerated, PPA-based, volume-selective excitation of a tissue region of a patient in the magnetic resonance tomography apparatus by performing the steps of:

(a) radiating, from a first of said component coils of said transmission coil array, a first series of volume-selected RF excitation pulses along a first transmission trajectory in transmission κ-space, said first transmission trajectory being reduced by an acceleration factor AF;

(b) receiving magnetic resonance signals, produced in said tissue region of the patient in response to said first series of volume-selected RF excitation pulses, along a complete reception trajectory in reception k-space with all component coils of said reception coil array simultaneously;

(c) repeating steps (a) and (b) in succession for all further of said component coils of said transmission coil array;

(d) simultaneously radiating, from all of said component coils of said transmission coil array, a second series of volume-selective RF excitation pulses along a second reduced transmission trajectory in transmission κ-space;

(e) receiving magnetic resonance signals, produced in said tissue region of the patient in response to said second series of volume-selective RF excitation pulses, along the same complete reception trajectory in reception k-space with all of said component coils of said reception coil array simultaneously;

(f) for AF>2, repeating steps (d) and (e) until all of said reduced transmission trajectories in transmission κ-space form a complete transmission trajectory in transmission κ-space;

(g) automatically electronically determining combination coefficients dependent on all of the received magnetic resonance signals; and (h) from said combination coefficients, automatically electronically calculating transmission coil-specific RF excitation pulses for the respective component coils of the transmission coil array that generate a selected excitation profile for said tissue region by simultaneous radiation of said transmission coil-specific RF excitation pulses along said reduced first transmission trajectory by multiple component coils of said transmission coil array.

* * * * *